United States Patent
Lu et al.

(10) Patent No.: US 11,177,137 B2
(45) Date of Patent: Nov. 16, 2021

(54) WAFER ETCHING PROCESS AND METHODS THEREOF

(71) Applicant: Taiwan Semiconductor Manufacturing Company, Ltd., Hsinchu (TW)

(72) Inventors: Wen-Hsiung Lu, Tainan (TW); Hui-Min Huang, Taoyuan (TW); Ming-Da Cheng, Taoyuan (TW); Wei-Hung Lin, Xinfeng Township (TW); Chen-En Yen, Changhua County (TW); Hsu-Lun Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/746,067

(22) Filed: Jan. 17, 2020

(65) Prior Publication Data

US 2021/0225658 A1    Jul. 22, 2021

(51) Int. Cl.
*H01L 21/311* (2006.01)
*H01L 21/3065* (2006.01)
(Continued)

(52) U.S. Cl.
CPC .. *H01L 21/31116* (2013.01); *H01L 21/30655* (2013.01); *H01L 21/31138* (2013.01); *H01L 21/31144* (2013.01); *H01L 21/32136* (2013.01); *H01L 21/32139* (2013.01); *H01L 21/76829* (2013.01)

(58) Field of Classification Search
None
See application file for complete search history.

(56) References Cited

U.S. PATENT DOCUMENTS 6,180,533 B1    1/2001  Jain et al.
7,368,394 B2 *  5/2008  Shen ............... H01L 21/32137
                                                216/76
(Continued)

OTHER PUBLICATIONS

Xu, T., et al., "Effects of deep reactive ion etching parameters on etching rate and surface morphology in extremely deep silicon etch process with high aspect ratio," Advances in Mechanical Engineering, Special Issue Article, 2007, vol. 9, No. 12, pp. 1-19.

*Primary Examiner* — Shamim Ahmed
(74) *Attorney, Agent, or Firm* — Slater Matsil, LLP

(57) ABSTRACT

A method includes bonding a first surface of a first semiconductor substrate to a first surface of a second semiconductor substrate and forming a cavity in the first area of the first semiconductor substrate, where forming the cavity comprises: supplying a passivation gas mixture that deposits a passivation layer on a bottom surface and sidewalls of the cavity, where during deposition of the passivation layer, a deposition rate of the passivation layer on the bottom surface of the cavity is the same as a deposition rate of the passivation layer on sidewalls of the cavity; and etching the first area of the first semiconductor substrate using an etching gas, where the etching gas is supplied concurrently with the passivation gas mixture, etching the first area of the first semiconductor substrate comprises etching in a vertical direction at a greater rate than etching in a lateral direction.

20 Claims, 12 Drawing Sheets

(51) Int. Cl.
*H01L 21/3213* (2006.01)
*H01L 21/768* (2006.01)

(56) References Cited

U.S. PATENT DOCUMENTS

| | | | |
|---|---|---|---|
| 2003/0207579 A1* | 11/2003 | Rattner | H01L 21/3065 |
| | | | 438/700 |
| 2004/0082177 A1 | 4/2004 | Lee | |
| 2004/0222190 A1 | 11/2004 | Horiguchi et al. | |
| 2007/0108160 A1 | 5/2007 | Ngo et al. | |
| 2007/0243714 A1 | 10/2007 | Shin et al. | |
| 2008/0061029 A1* | 3/2008 | Lai | B81C 1/00626 |
| | | | 216/37 |
| 2010/0003827 A1* | 1/2010 | Kessels | C23C 16/402 |
| | | | 438/719 |
| 2010/0105209 A1* | 4/2010 | Winniczek | H01J 37/32082 |
| | | | 438/696 |
| 2010/0244247 A1* | 9/2010 | Chang | H01L 21/76898 |
| | | | 257/741 |
| 2011/0207323 A1* | 8/2011 | Ditizio | H01L 21/3065 |
| | | | 438/675 |
| 2015/0162240 A1 | 6/2015 | Chiu | |
| 2015/0192487 A1 | 7/2015 | Belov et al. | |
| 2019/0115220 A1* | 4/2019 | Lin | H01L 21/28088 |
| 2019/0131140 A1* | 5/2019 | Sun | H01L 21/31116 |
| 2019/0157407 A1* | 5/2019 | Singh | H01L 29/7853 |
| 2019/0363093 A1* | 11/2019 | Chen | H01L 29/6659 |

* cited by examiner

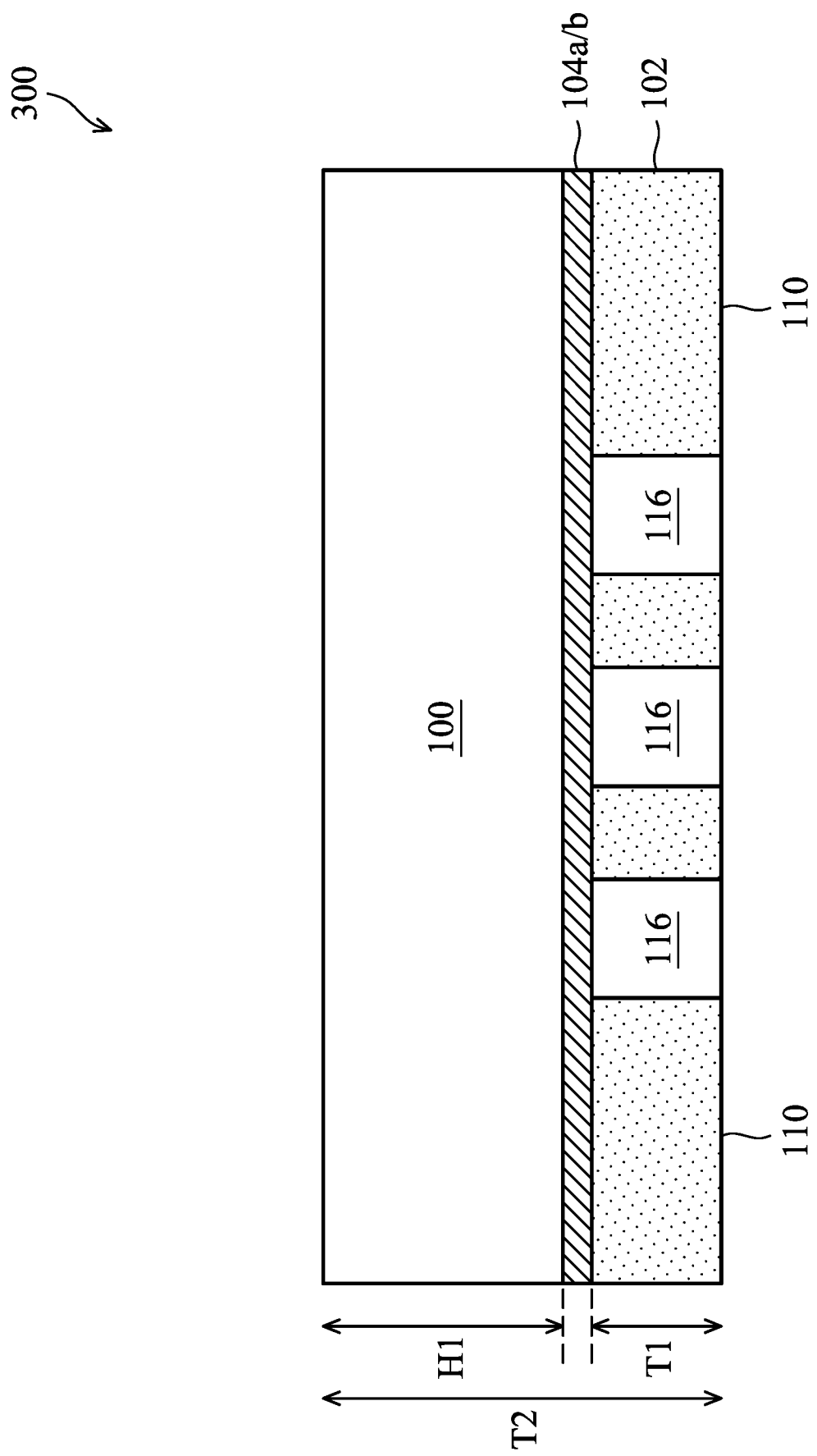

WAFER ETCHING PROCESS AND METHODS THEREOF

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A through 1B illustrate cross-sectional views of various intermediary steps of manufacturing a device according to some embodiments.

DETAILED DESCRIPTION

Figure 1B:
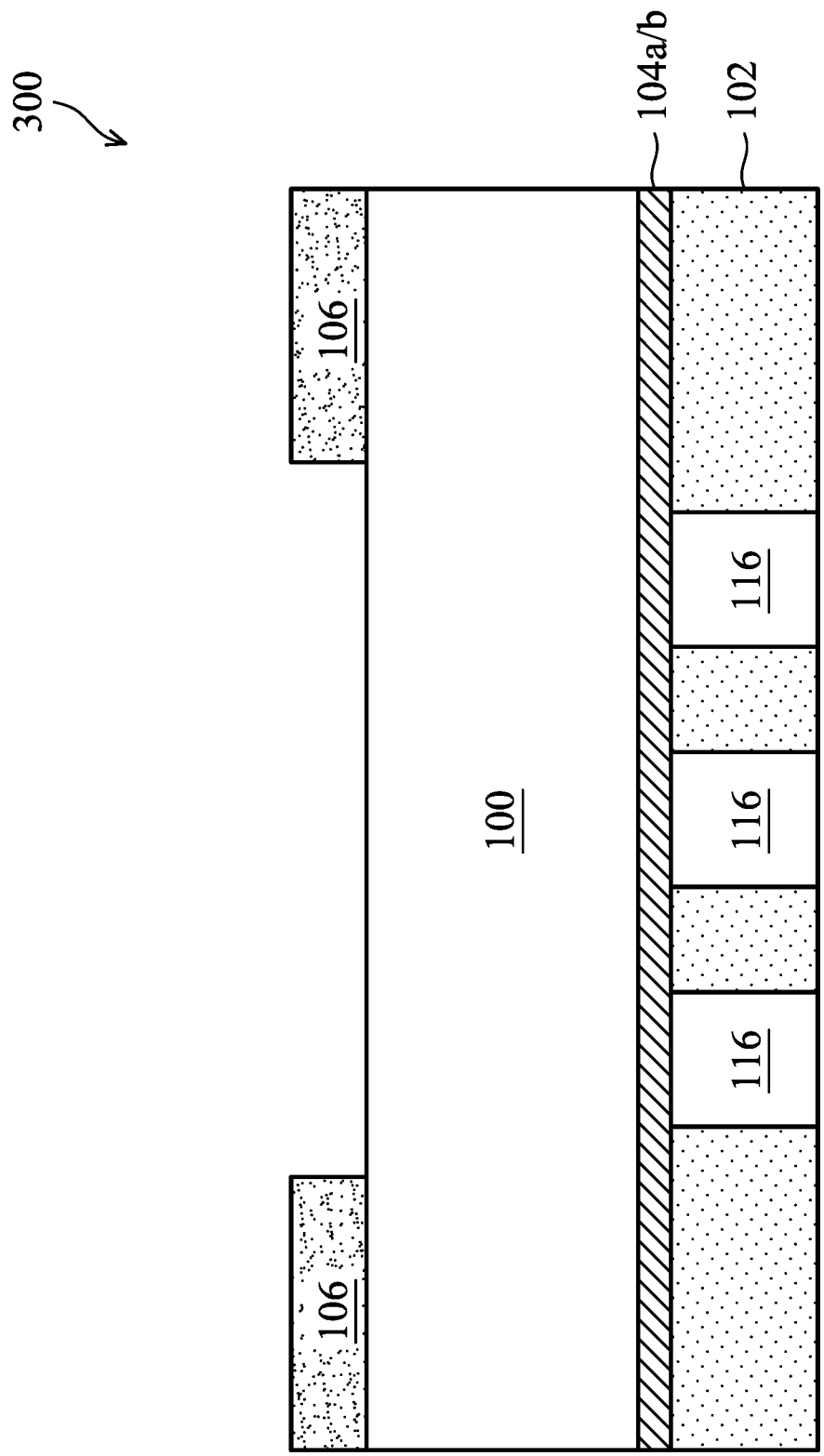

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein relate to methods of manufacture of a device (e.g., a light emitting diode (LED) device, a microelectromechanical systems (MEMS) device, or the like) having a backside cavity. Various embodiments include methods for a dry etch process applied to, but not limited to, the formation of a silicon backside cavity with specific etch profile angles. Advantageous features of one or more embodiments disclosed herein may include the ability to control the etch profile angle and to provide better deposition (e.g., physical vapor deposition (PVD)) step coverage on the backside cavity walls. Employing of an embodiment such as those disclosed herein, is less dependent upon a specific crystal orientation of the silicon wafer during a wet etching process. In addition, some embodiments may reduce the need for one or more masking layers during the formation of the backside cavity, simplifying the process and making it more cost-effective.

Figure 1C:
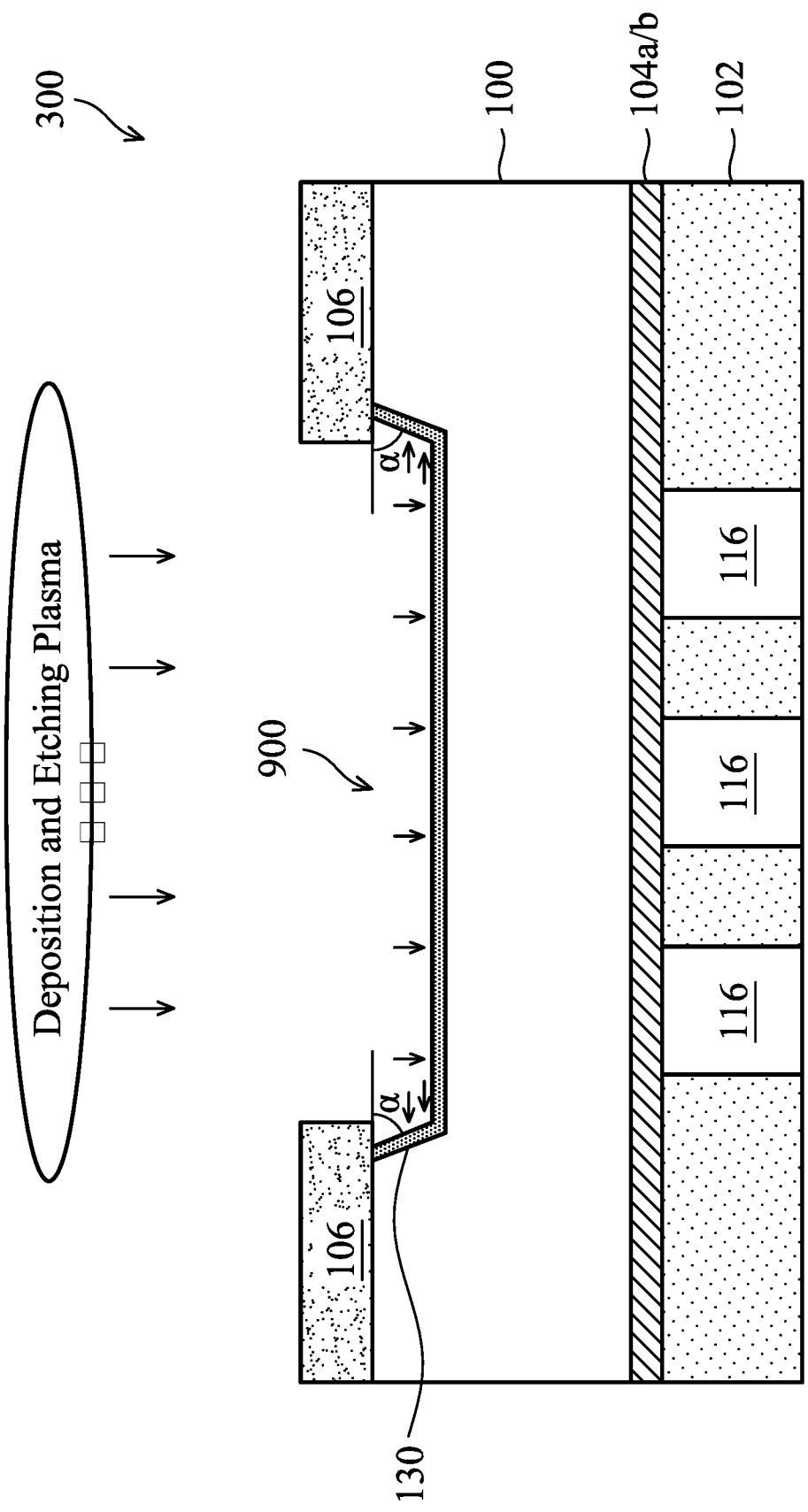
FIG. 1C illustrates a cross-sectional view to illustrate an intermediary etching step in the manufacture of a device according to some embodiments.
Figure 1D:
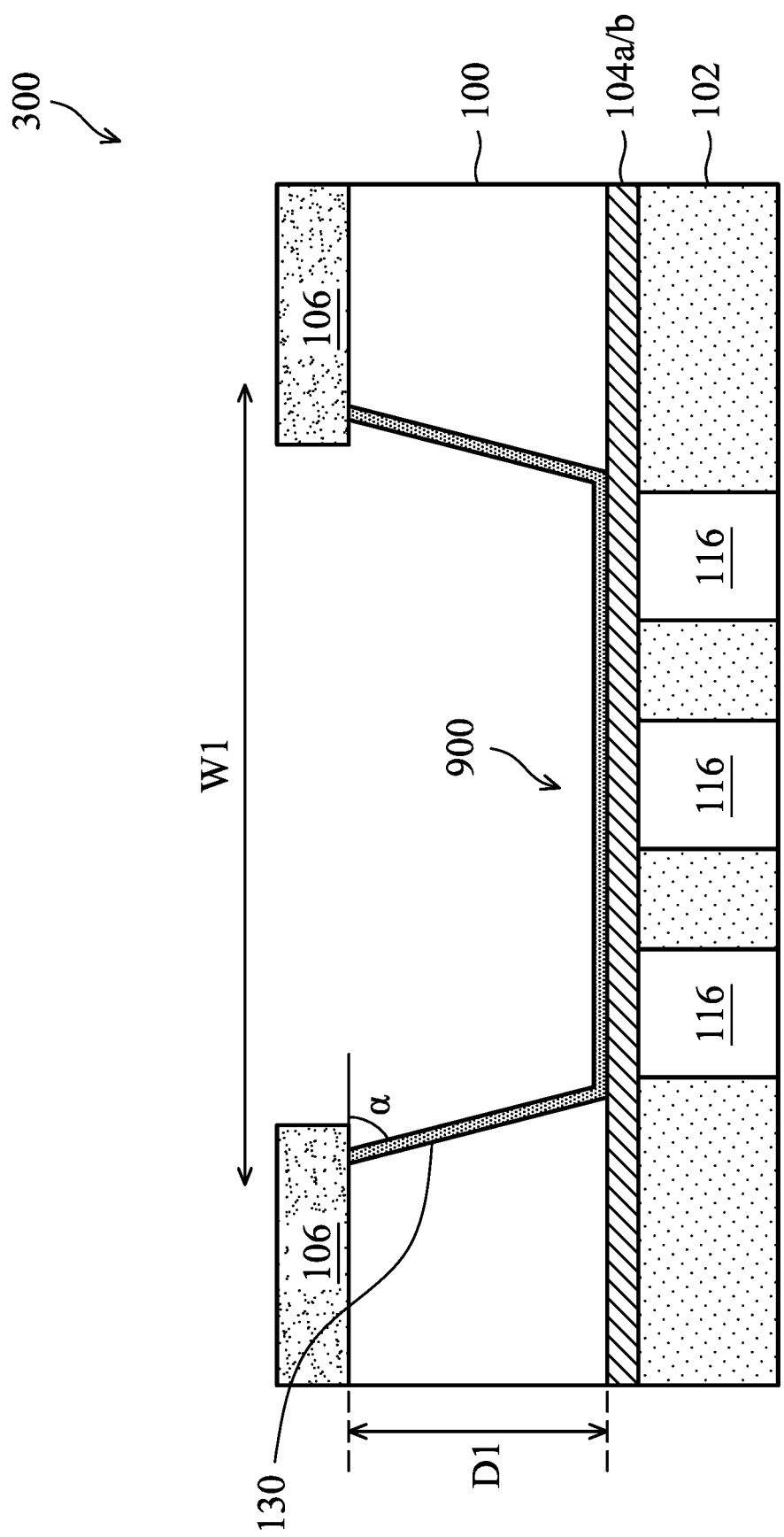
FIGS. 1D through 1E illustrate cross-sectional views of various intermediary steps of manufacturing a device according to some embodiments.

FIGS. 1A through 1E are various cross-sectional views of intermediate steps during a process for forming a device by bonding a substrate to a semiconductor die in accordance with some embodiments. FIG. 1A illustrates a bonding process in which the semiconductor substrate 100 is bonded to a semiconductor die 102 to form a bonded semiconductor substrate 300. FIGS. 1C through 1D illustrate a subsequent etching process where a backside cavity is formed in the semiconductor substrate 100 of the bonded semiconductor substrate 300. By using various etching configurations, the etching profile angle of the backside cavity can be controlled.

Referring first to FIG. 1A, there is shown the semiconductor die 102 and the semiconductor substrate 100 that have been bonded together to form the bonded semiconductor substrate 300. Although the semiconductor die 102 is referred to as a "die" herein, it should be understood that the semiconductor die 102 may be formed as part of a larger wafer (e.g., connected to other dies). Subsequently, the semiconductor die 102 may be singulated from other features of the wafer. The singulation process for semiconductor die 102 may be performed prior to bonding to form the bonded semiconductor substrate 300 or after bonding to form the bonded semiconductor substrate 300. The semiconductor die 102 may be a bare chip semiconductor die (e.g., unpackaged semiconductor die). For example, the semiconductor die 102 may be a logic die (e.g., central processing unit, microcontroller, etc.), a memory die (e.g., dynamic random access memory (DRAM) die, hybrid memory cube (HBC), static random access memory (SRAM) die, a wide input/output (wideIO) memory die, magnetoresistive random access memory (mRAM) die, resistive random access memory (rRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) die), a biomedical die, or the like. In alternate embodiments, both the semiconductor die 102 and the semiconductor substrate 100 may be formed as part of larger wafers, and the semiconductor die 102 may also be referred to as a substrate. The semiconductor die 102 and the semiconductor substrate 100 may comprise individual singulated dies.

The semiconductor die 102 may be processed to form integrated circuits within the semiconductor die 102 by use of applicable manufacturing processes. For example, the semiconductor die 102 may include a semiconductor substrate which may comprise doped or undoped silicon. The semiconductor die 102 may also include an active layer of a semiconductor-on-insulator (SOI) substrate. The semiconductor substrate may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates such as multi-layered or gradient substrates may also be used. Devices, such as transistors, diodes, capacitors, resistors, etc., may be formed in semiconductor die 102 and may be interconnected by interconnect structures (not shown) comprising, for example, metallization patterns in one or more dielectric layers in the semiconductor die 102. The devices and the interconnect structures form one or more integrated circuits. The interconnect structures may comprise any number of metallization patterns disposed in any number of dielectric layers.

In some embodiments, the semiconductor die 102 may include one or more MEMS devices, comprising a MEMS structure 116. The MEMS structure 116 may include a movable element that is freely moveable along at least one axis, such as a flexible membrane, a cantilevered beam, or the like. MEMS devices may take the form of micromachined substrates that have been integrated with electronic circuits. These devices can be formed on different types of substrates using a variety of micro-electronic techniques such as vapor deposition, photolithography and etching. MEMS devices may include sensors, actuators and oscillators that may operate on electromagnetic, electrostrictive, thermoelectric, piezoelectric, or piezoresistive effects.

In alternative embodiments, the semiconductor die 102 may be an interposer wafer, which is free from active devices therein. The semiconductor die 102 may or may not include passive devices (not shown) such as resistors, capacitors, inductors, transformers, and the like in accordance with some embodiments.

The semiconductor substrate 100 may comprise, for example, bulk silicon, which may be doped or undoped. The semiconductor substrate 100 may comprise silicon having one of any number of crystal orientations that may include <100>, <110>, and <110> families of crystal directions. In some embodiments, the semiconductor substrate 100 has a height $H_1$ between about 50 um and about 770 um, such as about 720 μm.

The semiconductor substrate 100 is bonded to a surface of the semiconductor die 102 using a suitable technique such as dielectric-to-dielectric bonding, metal-to-metal bonding, hybrid bonding or the like. For example, in various embodiments, the semiconductor die 102 may be bonded to the semiconductor substrate 100 using dielectric-to-dielectric bonding by use of a bonding layer 104a and a bonding layer 104b on the surfaces of semiconductor substrate 100 and semiconductor die 102, respectively. In some embodiments, the bonding layers 104a and bonding layer 104b may each comprise silicon oxide formed on the surfaces of the semiconductor substrate 100 and the semiconductor die 102, respectively by a deposition process, such as chemical vapor deposition (CVD), physical vapor deposition (PVD), or the like. In other embodiments, the bonding layers 104a and 104b may be formed by the thermal oxidation of silicon surfaces on the semiconductor substrate 100 and the semiconductor die 102, respectively. In alternative embodiments, the bonding layer 104a and the bonding layer 104b may comprise silicon oxynitride, silicon nitride, or the like.

Prior to bonding, at least one of the bonding layers 104a or 104b may be subjected to a surface treatment. The surface treatment may include a plasma treatment. The plasma treatment may be performed in a vacuum environment. After the plasma treatment, the surface treatment may further include a cleaning process (e.g., a rinse with deionized water, or the like) that may be applied to the bonding layer 104a and/or bonding layer 104b. The semiconductor substrate 100 is then aligned with the semiconductor die 102 and the two are pressed against each other to initiate a pre-bonding of the semiconductor substrate 100 to the semiconductor die 102. The pre-bonding may be performed at room temperature (between about 21 degrees and about 25 degrees). The bonding time may be shorter than about 1 minute, for example. After the pre-bonding, the semiconductor substrate 100 and the semiconductor die 102 are bonded to each other. The bonding process may be strengthened by a subsequent annealing step. For example, this may be done by heating the semiconductor substrate 100 and the semiconductor die 102 to a temperature of about 170 degrees for about 1 hour. In an alternative embodiment, hybrid bonding may also be used to bond the semiconductor substrate 100 to a surface of the semiconductor die 102, during which, metal pads are processed at room temperature in parallel with the dielectric-to-dielectric bonding process when forming the pre-bond, and metal diffusion bonding is then achieved during annealing via metal diffusion bonding.

After the semiconductor die 102 and the semiconductor substrate 100 are bonded, a thinning process may be applied to the semiconductor die 102. The thinning process may include grinding or CMP processes, etch back processes, or other acceptable processes performed on a surface 110 of the semiconductor die 102. As a result of this thinning process, the semiconductor die 102 may have a thickness T1 of about 50 μm and the bonded semiconductor substrate 300 may have a thickness T2 from about 100 um to about 770 μm. The semiconductor substrate 100 may have a thickness H1 of about 720 um.

FIG. 1B illustrates a mask layer 106 being formed and patterned on semiconductor substrate 100. The mask layer 106 is patterned to expose the areas of the semiconductor substrate 100 where the backside cavity will be formed. In some embodiments, the mask layer 106 may be a patterned photo resist layer. Generally, the photo resist layer may be deposited by spin coating or the like. After the photo resist layer is deposited, it may be patterned by exposing the photo resist layer to a patterned energy source (e.g. patterned light) and a developer. The developer removes exposed or unexposed portions of the photo resist layer depending on whether a positive or negative photo resist is used. Remaining portions of the photo resist layer forms the mask layer 106.

FIG. 1C illustrates an etching process performed to etch a portion of the semiconductor substrate 100 to form the cavity 900. FIG. 1C illustrates that the etching process is a highly anisotropic etching process to directionally etch the semiconductor substrate 100 to form a cavity 900 with sidewalls having a specific profile angle α with the top surface of semiconductor substrate 100. In some embodiments, the etching process may be a dry etch plasma process. The etching process is performed by concurrently supplying an etching gas and a passivation gas mixture. For example, in embodiments in which the semiconductor substrate 100 comprises silicon, an etching gas may comprise sulfur hexafluoride ($SF_6$) and the passivation gas mixture may comprise octafluorocyclobutane ($C_4F_8$) and oxygen ($O_2$). During the etching process, plasma is generated by an electric field using a continuously supplied RF source, resulting in the concurrent generation of a deposition plasma from the passivation gas mixture (e.g., $C_4F_8/O_2$) and an etching plasma from the etching gas (e.g., $SF_6$). The etching process comprises simultaneous deposition and etching portions, which occur as a result of the simultaneous supply of the etching gas and the passivation gas mixture. As discussed in greater detail below, the deposition portion comprises forming a passivation layer on a bottom surface and sidewalls of cavity 900. During the deposition portion, the deposition rate of the passivation layer is the same on the bottom surface and sidewalls of cavity 900. The etching portion comprises etching that takes place in both the lateral and vertical directions. During the etching portion, the vertical etching rate is greater than the lateral etching rate. The etching process is carried out until the cavity 900 is etched to the desired depth, such as through the semiconductor substrate 100 to the bonding layers 104a/b in this example.

In FIG. 1C, both the deposition and etching portions of the etching process are illustrated. These portions take place simultaneously and the control of the deposition rate of the passivation layer, vertical etching rate and lateral etching rate allow the controlled etching of cavity 900 to meet required dimensions. The deposition portion comprises exciting the passivation gas mixture (e.g., a mixture of $C_4F_8$ and $O_2$), using an RF power source and forming a deposition plasma that includes C and $CF_2$ radicals. The deposition portion passivates the bottom surface and sidewalls of cavity 900 by forming a polymer layer 130 on the bottom surface and sidewalls of cavity 900. This polymer layer 130 protects the sidewalls of cavity 900 from being etched away by the etching portion of the etching process. The growth rate of polymer layer 130 is the same or substantially the same on the bottom surface and sidewalls of cavity 900. For example, a ratio of the deposition rate of the polymer layer 130 on the sidewalls of cavity 900 to the deposition rate of the polymer layer 130 on the bottom surface of cavity 900 may be in the range of about 200% to about 100%.

FIG. 1C also illustrates the etching portion of the etching process that occurs at the same time as the deposition portion. The etching portion includes vertical etching, to remove a portion of the polymer layer 130 on the bottom surface of the cavity 900 that is being formed simultaneously as a result of the deposition portion of the etching process, and lateral etching, to remove portions of the polymer layer 130 on sidewalls of the cavity 900 that are being formed simultaneously as a result of the deposition portion of the etching process. The etching gas (e.g., $SF_6$) is excited by an RF power source (e.g., disposed over the semiconductor substrate 100) to generate an etching plasma. The excited ions from the etching plasma are accelerated by a separate RF bias power source (e.g., disposed under the semiconductor substrate 100) towards the bottom surface of the cavity 900 to bombard and remove the portion of the polymer layer 130 from the bottom surface of cavity 900, leaving the bottom of cavity 900 exposed. Because the etching plasma is generated directionally, the removal of polymer layer 130 on the sidewalls of the cavity 900 is less significant than the removal of the polymer layer 130 on the bottom surface of the cavity 900. This is because of a lower directional kinetic energy of ions bombarding the sidewalls of the cavity 900 compared to the bottom surface of the cavity 900. The less significant removal of polymer layer 130 from the sidewalls of cavity 900 protects the sidewalls of cavity 900 from being etched away by the etching portion of the etching process. Further, the more significant removal of polymer layer 130 from the bottom surface of the cavity 900 leaves the bottom surface of cavity 900 more exposed. Thus, the bottom surface of cavity 900 is more readily etched away as compared to the sidewalls of cavity 900. As a result, the etching portion has a vertical etching rate that is higher than a lateral etching rate of the etching process despite the deposition rate of the passivation layer being the same on the bottom surface and sidewalls of cavity 900.

The etching portion of the etching process further includes etching of the exposed portions of the semiconductor substrate 100. For example, when the excited ions from the etching plasma bombard the bottom surface and sidewalls of cavity 900, the polymer layer 130 may be removed to expose portions of the semiconductor substrate 100. The etching process includes etching these exposed portions of the semiconductor substrate 100 at the bottom surface and sidewalls of cavity 900 by reacting with the fluorine ions of the etching plasma from the excited etching gas (e.g., $SF_6$). Etching takes place at the portions of semiconductor substrate 100 that are exposed after polymer layer 130 has been removed by the ion bombardment as described earlier in FIG. 1C. The deposition and etching portions of the etching process will continue as long as a simultaneous supply of the etching gas and the passivation gas mixture is provided.

By adjusting the ratio of the passivation gas mixture (e.g., $C_4F_8/O_2$) flowrate to the etching gas (e.g., $SF_6$) flowrate and the RF bias power source, the lateral etching rate and the vertical etching rate can be controlled. In this way, cavity 900 may have sidewalls with a controllable profile angle α with the top surface of semiconductor substrate 100. Lowering the ratio of the passivation gas mixture (e.g., $C_4F_8/O_2$) flowrate to the etching gas (e.g., $SF_6$) flowrate leads to a decrease in the lateral etching rate and hence slower removal of the sidewalls of cavity 900 and the portion of the polymer layer 130 on the sidewalls of cavity 900. A lower lateral etching rate will lead to an increase in the specific profile angle α with the top surface of the semiconductor substrate 100. Conversely, increasing the ratio of the passivation gas mixture (e.g., $C_4F_8/O_2$) flowrate to the etching gas (e.g., $SF_6$) flowrate leads to an increase in the lateral etching rate and hence increases the removal of the sidewalls of cavity 900 and the portion of the polymer layer 130 on the sidewalls of cavity 900. This increase in the lateral etching rate will lead to a decrease in the specific profile angle α with the top surface of the semiconductor substrate 100.

In this way, varying the lateral etching rate can be used to vary the specific profile angle α with the top surface of semiconductor substrate 100. In an embodiment, the sidewalls of cavity 900 may have a profile angle α=90° when the lateral etching rate is negligible. In an embodiment, the sidewalls of cavity 900 may have a profile angle α that is less than 90° when there is an increase in the lateral etching rate, wherein the lateral etching rate is not negligible. The degree of the difference in the lateral etching rate of the sidewalls of cavity 900 and the portion of the polymer layer 130 on the sidewalls of cavity 900 helps determine the profile angle α of the sidewalls of cavity 900.

Adjustment of the RF bias power source may also be used to control the specific profile angle α with the top surface of the semiconductor substrate 100. A higher RF bias power source will better attract ions towards the bottom surface of cavity 900, leading to an increase in the vertical etching rate, and may also lead to less ion bombardment of the sidewalls of cavity 900, therefore leading to less removal of polymer layer 130. In such embodiments, lateral etching is reduced since there is more protection from lateral etching by the unremoved portions of polymer layer 130. A higher RF bias power source may lead to a larger profile angle α, while a lower RF bias power source may lead to a lower profile angle α.

FIG. 1D illustrates cavity 900 after the completion of the etching process. The etching process may result in the cavity 900 having portions of polymer layer 130 that remain on the bottom surface and sidewalls of cavity 900. In an embodiment, the etching process may be carried out until the cavity 900 is etched through the semiconductor substrate 100 to the bonding layers 104a/b.

Figure 1E:
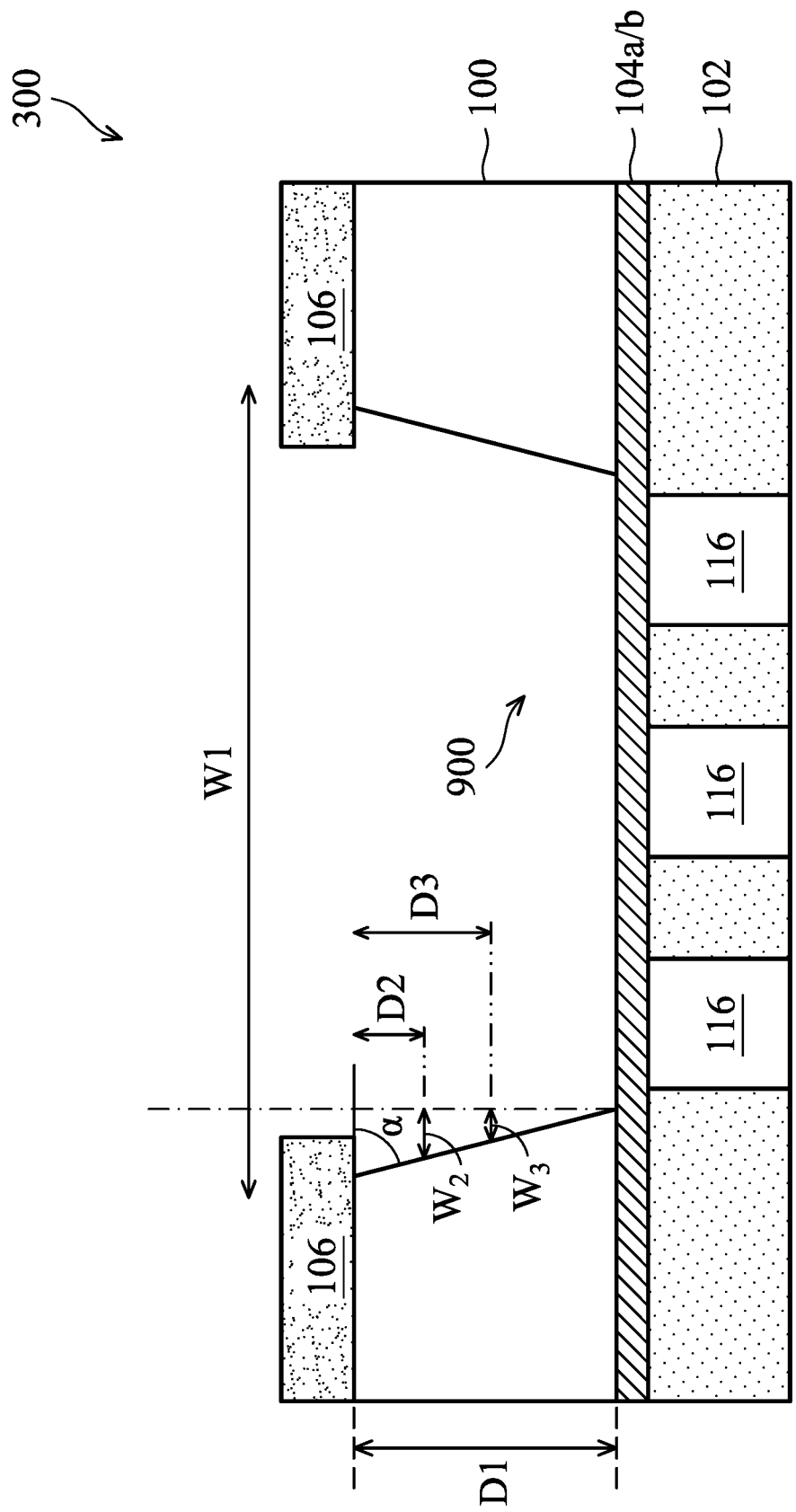

FIG. 1E illustrates cavity 900 after the removal of the remaining portions of polymer layer 130 from the bottom surface and sidewalls of cavity 900 by use of a suitable etching technique. In an embodiment, the etching process illustrated earlier in FIG. 1C may result in the cavity 900 having sidewalls with a profile angle α with the top surface of semiconductor substrate 100. In an embodiment, the specific profile angle α, can range from 55° to 90. The vertical depth D1 of the cavity, measured from the top surface of the semiconductor substrate 100 to the bottom surface of the cavity, may be about 720 μm or less, and the etch may expose the bonding layer 104a/b below the semiconductor substrate 100. A width W1 of the cavity 900, measured between the top of the sidewalls of the cavity 900 may be in a range of about 13 mm to about 17 mm, such as about 14 mm. The etching process may comprise etching in both a lateral and vertical direction that results in a linear surface on the sidewalls of cavity 900. The magnitude of lateral etching on the sidewalls may decrease proportionate with an increase in vertical depth from the top surface of the semiconductor substrate 100. For example, at a vertical depth D2 from the top surface of semiconductor substrate 100, the horizontal width of the sidewall of cavity 900 from a point at the bottom of the sidewall of cavity 900 may be W2. At a vertical depth D3 from the top surface of the semiconductor substrate 100, the horizontal width of the sidewall of cavity 900 from a point at the bottom of the sidewall of cavity 900 may be W3, where D3 is greater than D2 and W3 is less than W2. In some embodiments, the higher the ratio of W2 to W3, the smaller the specific profile angle α.

In some examples, the passivation gas mixture is supplied at a flow rate higher than the etching gas. In an embodiment, the passivation gas mixture includes $C_4F_8/O_2$ and is provided at a flowrate from about 500 sccm to about 1600 sccm, such as about 953 sccm, and an etching gas that includes $SF_6$ and is provided at a flowrate from about 150 sccm to about 550 sccm, such as about 355 sccm. In some examples, the passivation gas mixture flowrate and the etching gas flowrate during the etching process may have a ratio in a range from about 4:1 to about 0.5:1, such as about 2.7:1. In some examples, the dry plasma etching process comprises a RF source power, RF secondary power source and RF bias power source. The RF source power may be in a range from about 1000 Watts to about 3000 Watts, such as about 2800 Watts, the RF secondary power source may be in the range of about 500 Watts to about 2000 Watts, such as about 800 Watts, and the RF bias power source may be in a range from about 50 Watts to about 500 Watts, such as about 240 Watts, at a frequency in a range of about 10 MHz to about 15 MHz, such as about 13.56 MHz. The RF source power, RF secondary power source and the RF bias power source may be continuously supplied, the RF source power and RF secondary power source are used to generate the etching plasma. The RF bias power source is used to accelerate ions to bombard the bottom surface of the cavity 900 that is being etched. The process pressure is controlled in a range from 16 mTorr to about 300 mTorr, such as about 150 mTorr. The substrate temperature is controlled in a range from about 0 degrees Celsius to about 50 degrees Celsius, such as about 5 degrees Celsius.

In some embodiments, the profile angle α can range from 55° to 90°. In some examples, the specific profile angle α is 80° when the passivation gas mixture ($C_4F_8/O_2$) flowrate to etching gas ($SF_6$) flowrate ratio during the etching process is about 2.7:1. In other examples, the specific profile angle α is 55° when the passivation gas mixture ($C_4F_8/O_2$) flowrate to etching gas ($SF_6$) flowrate ratio during the etching process is about 1:1. In some embodiments, the specific profile angle α is 80° when the passivation gas mixture ($C_4F_8/O_2$) flowrate to etching gas ($SF_6$) flowrate ratio during the etching process is about 2.7:1 and the RF bias power source is 190 Watts. In other embodiments, the specific profile angle α is 55° when the passivation gas flowrate to etching gas flowrate ratio during the etching process is about 2.7:1 and the RF bias power source is 50 Watts. As described earlier, the specific profile angle α may be tuned by changes in passivation gas flowrate to etching gas flowrate ratio and/or RF bias power source.

Figure 2:
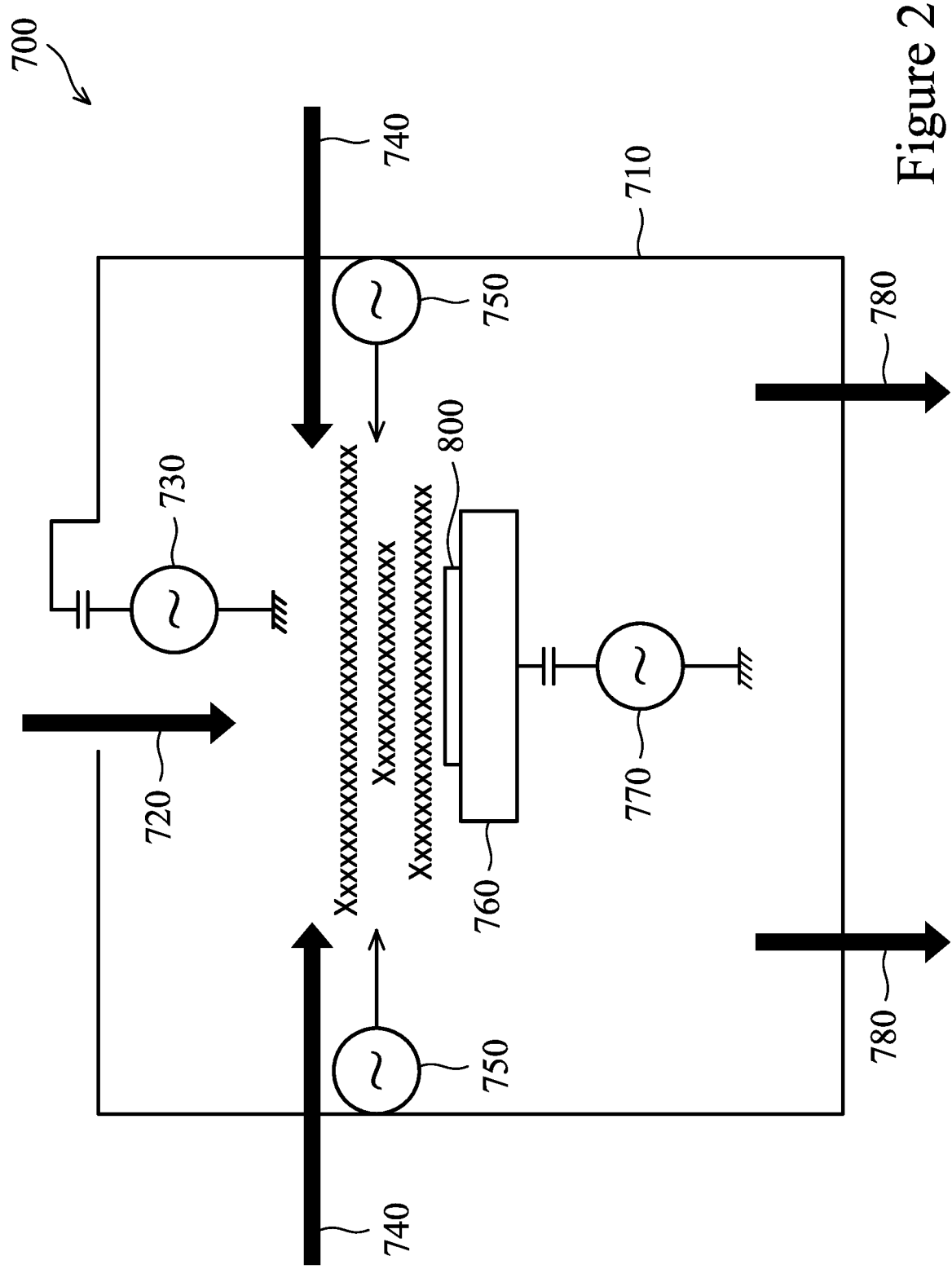
FIG. 2 illustrates an etching system, in accordance with some embodiments.

FIG. 2 illustrates an etching system 700 in accordance with an embodiment of the present disclosure. As illustrated in FIG. 2, an etching system includes a chamber 710 and a platen 760 on which a wafer 800 may be processed. The temperature of the platen 760 can be controlled by the controlled flow of helium gas to it to maintain a desired temperature. Wafer 800 may be held in place on the platen 760 by, e.g., an electrostatic chuck (not shown) on the top surface of the platen 760. Wafer 800 may include a plurality of devices at a certain stage of the fabrication process, such as bonded semiconductor substrates 300. For example, wafer 800, when initially loaded onto the platen 760, may include a plurality of bonded semiconductor substrates 300 at the stage shown in FIG. 1B, thus mask layer 106 exposes areas of the semiconductor substrate 100 that are ready to be recessed by an etching process to form the cavity 900 illustrated in FIG. 1E. Therefore, chamber 710 serves as the etching chamber to perform the etching process to recess the semiconductor substrate 100 as described above with reference to FIGS. 1A-1E.

Referring to FIG. 2, etching system 700 includes a primary gas inlet 720 located above the top surface of the wafer 800 and platen 760. There are also two secondary gas inlets 740 located at edges, on opposite sides of the wafer 800 and platen 760. The secondary gas inlets 740 are used to evenly distribute gases and to help maintain process uniformity throughout wafer 800. Although two secondary inlets 740 are illustrated in FIG. 2, more or fewer than two secondary gas inlets 740 may be used to control the distribution of gases into chamber 710. The primary gas inlet 720 and secondary gas inlets 740 are used to supply reactant gases into the chamber.

As illustrated in FIG. 2, etching system 700 also includes two gas outlets 780. Although two outlets 780 are shown in FIG. 2, any number of outlets 780 may be used in etching system 700. Air and gases may be pumped out simultaneously. Chamber 710 forms an enclosed space during processing, and the removal of air or gases out of chamber 710 allows a desired pressure level to be maintained.

Also shown to FIG. 2, the etching system 700 includes a number of RF power sources. The RF source power 730 generates plasma above the top surface of the wafer 800 and the platen 760. Two other sources, RF secondary power sources 750, generate plasma at the edges, on opposite sides of the wafer 800. The RF secondary power sources 750 are used to evenly distribute plasma and to help maintain process uniformity throughout wafer 800. Although two RF secondary power sources 750 are illustrated in FIG. 2, more or fewer than two RF secondary power sources 750 may be used. The etching system also includes an RF bias power source 770 to accelerate the generated plasma towards the surface of the wafer 800.

FIG. 2 is merely a simplified example, skilled artisans will appreciate many variations. As an example, the shape of chamber 710 may have different shapes, for example, cylindrical, conical or other suitable shapes. Skilled artisans will also appreciate that not all components of an etching system are illustrated in FIG. 2. For example, a loading unit for loading and unloading wafer 800 is not illustrated in FIG. 2. A gas supply (not shown) which may include a mixer (not shown) for mixing different reactant gases and a pump (not shown) for pumping gases into chamber 710, as another example.

FIGS. 3A through 3D illustrate further intermediary steps in the manufacture of the device referred to earlier in FIGS. 1A through 1E. After the cavity 900 has been formed, the exposed portion of the bonding layers 104*a/b* within cavity 900 is removed. The exposed portion of the bonding layers 104*a/b* within cavity 900 may be removed by an acceptable dry and/or wet etch process. For example, in embodiments in which the bonding layers 104*a/b* comprise silicon oxide, a dry etch process using a mixture of nitrogen trifluoride ($NF_3$) and ammonia ($NH_3$) may be used. Alternatively, a mixture of hydrogen fluoride (HF) and ammonia ($NH_3$) may be used. A portion of the top surface of the semiconductor die 102 may be exposed through the bottom of the cavity 900.

Figure 3A:
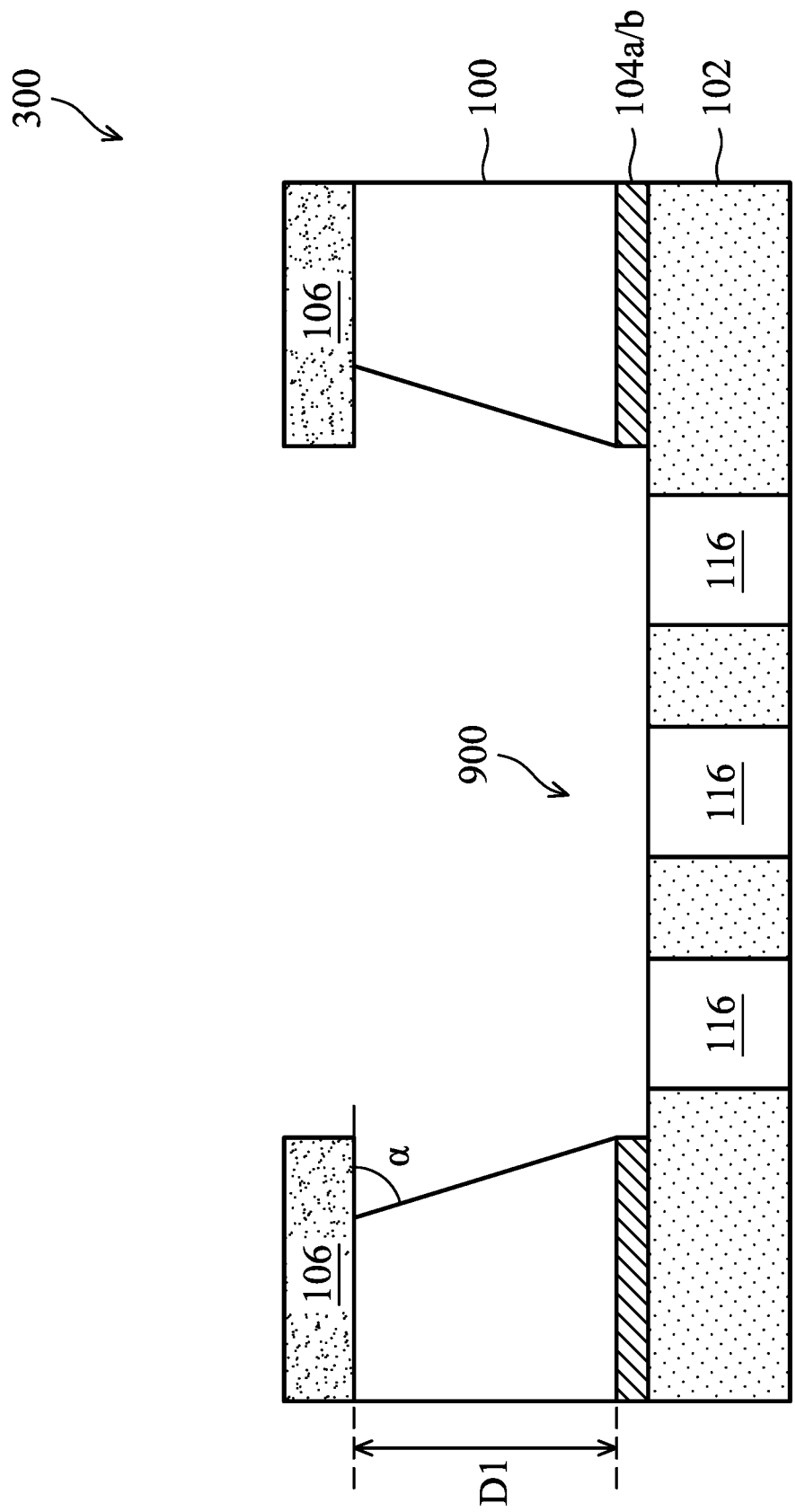
FIGS. 3A through 3D illustrate cross-sectional views of various intermediary steps of manufacturing a device according to some embodiments.
Figure 3B:
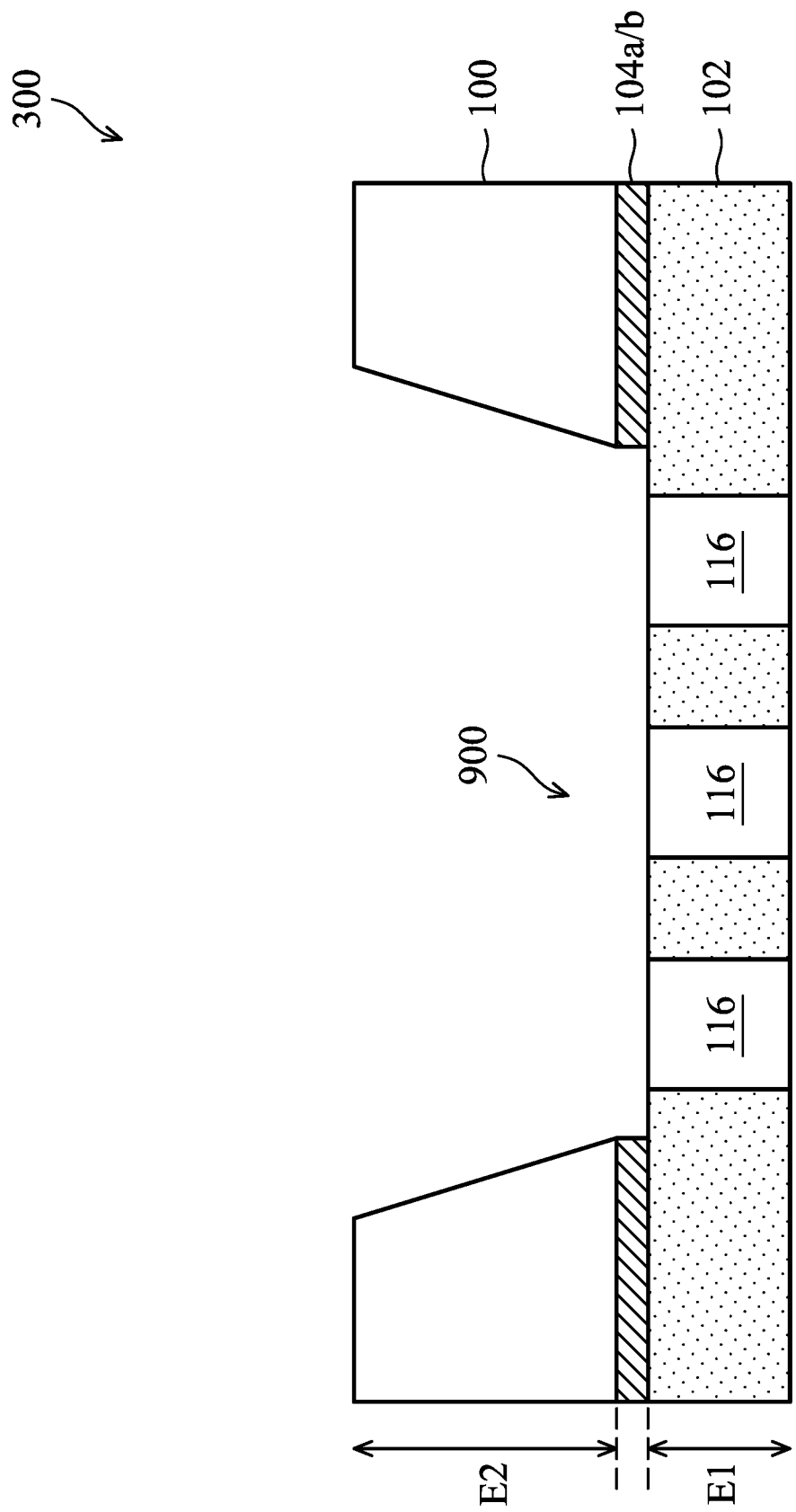

FIG. 3B illustrates the removal of the mask layer 106 from the top surface of the semiconductor substrate 100 in accordance with some embodiments. The photoresist 106 may be removed using a suitable photoresist stripping technique, such as chemical solvent cleaning, plasma ashing, dry stripping and/or the like. In some embodiments, the vertical depth E2, from the top surface of the semiconductor substrate 100 to the bottom of cavity 900, exceeds the thickness E1 of the semiconductor die 102. In an embodiment, the vertical depth E2, from the top surface of the semiconductor substrate 100 to the bottom of cavity 900, may be in a range of about 50 um to about 770 um, such as about 720 um, and the thickness E1 of the semiconductor die 102, may be in a range of about 20 um to about 500 um, such as about 50 um.

Figure 3C:
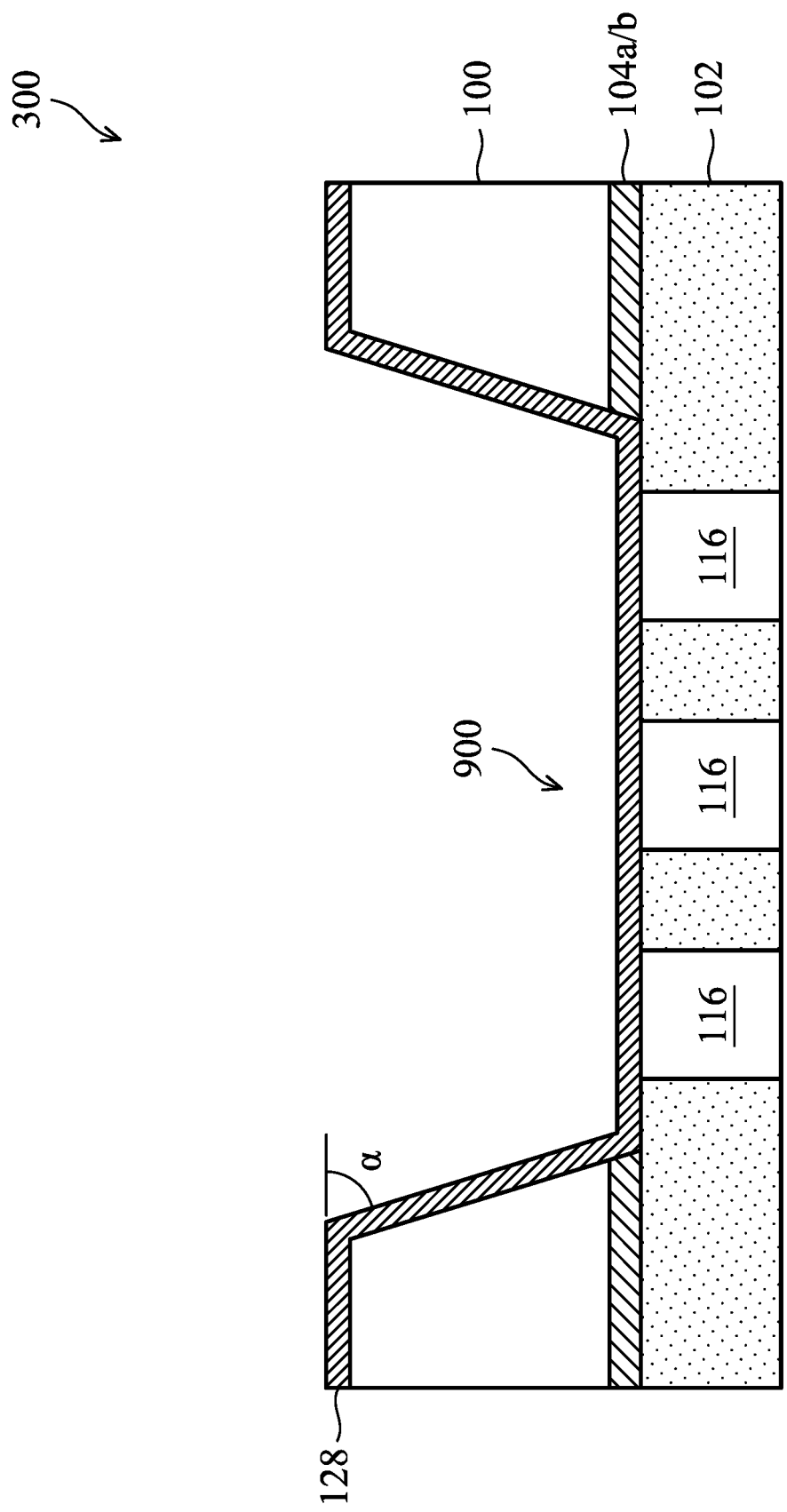

FIG. 3C illustrates the deposition of thin-film layer 128 over the upper surface of semiconductor substrate 100, as well as the sidewalls and the bottom surface of cavity 900. In some embodiments, the thin-film layer 128 may include titanium (Ti) or gold (Au). The thin-film layer 128 may be formed by physical vapor deposition (PVD) and/or other suitable methods. In some embodiments, cavity 900 may have sidewalls having a profile angle α with the top surface of semiconductor substrate 100 and so may have a better physical vapor deposition (PVD) process step coverage on the sidewalls of cavity 900.

Figure 3D:
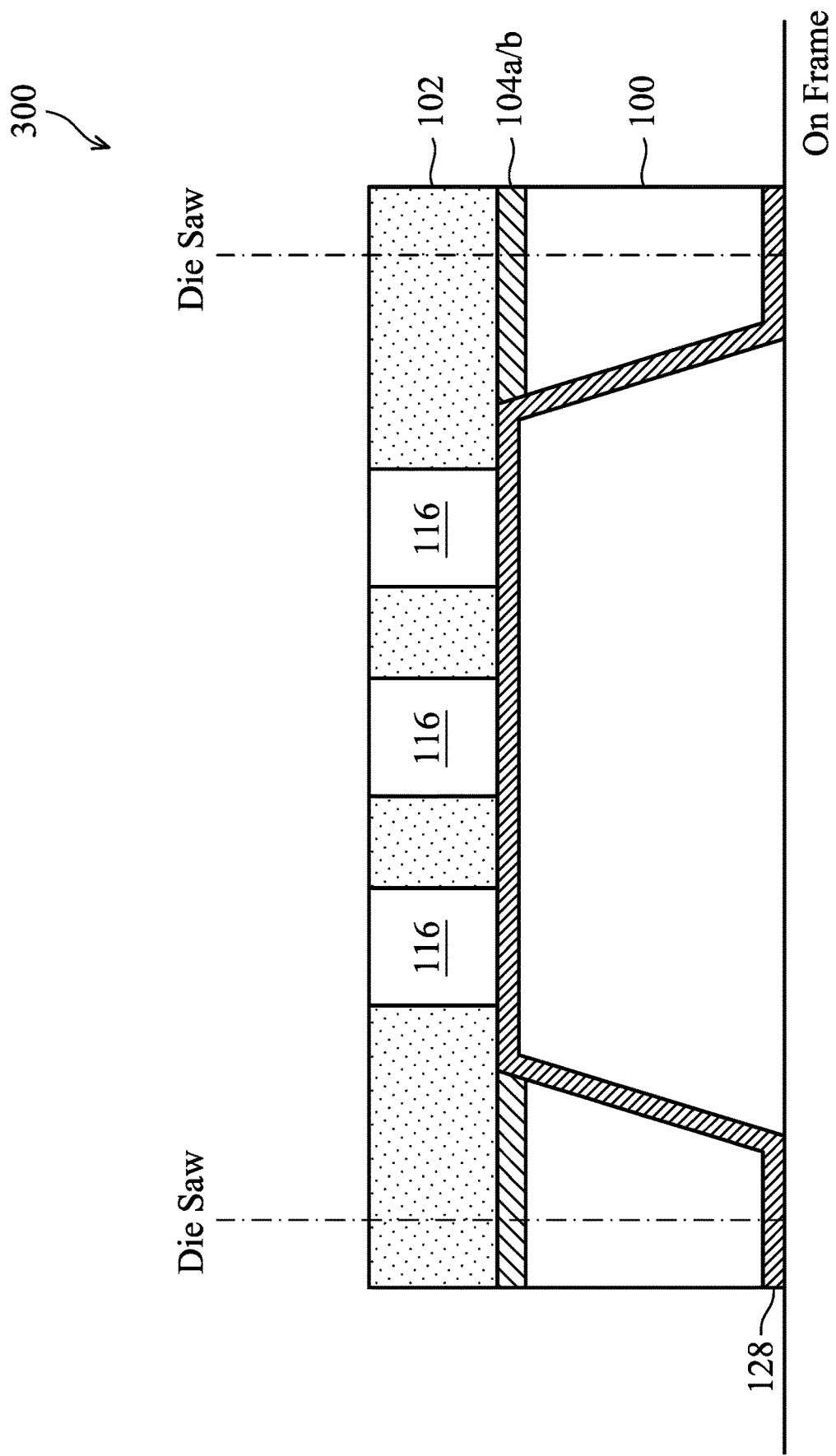

FIG. 3D illustrates the placing of bonded semiconductor substrate 300 on a frame, the frame comprising a metal ring with dicing tape on top of it. In some embodiments, the bonded semiconductor substrate 300 may then be sawed apart using a die saw as indicated to make it singulate the wafer into individual elements.

Figure 4:
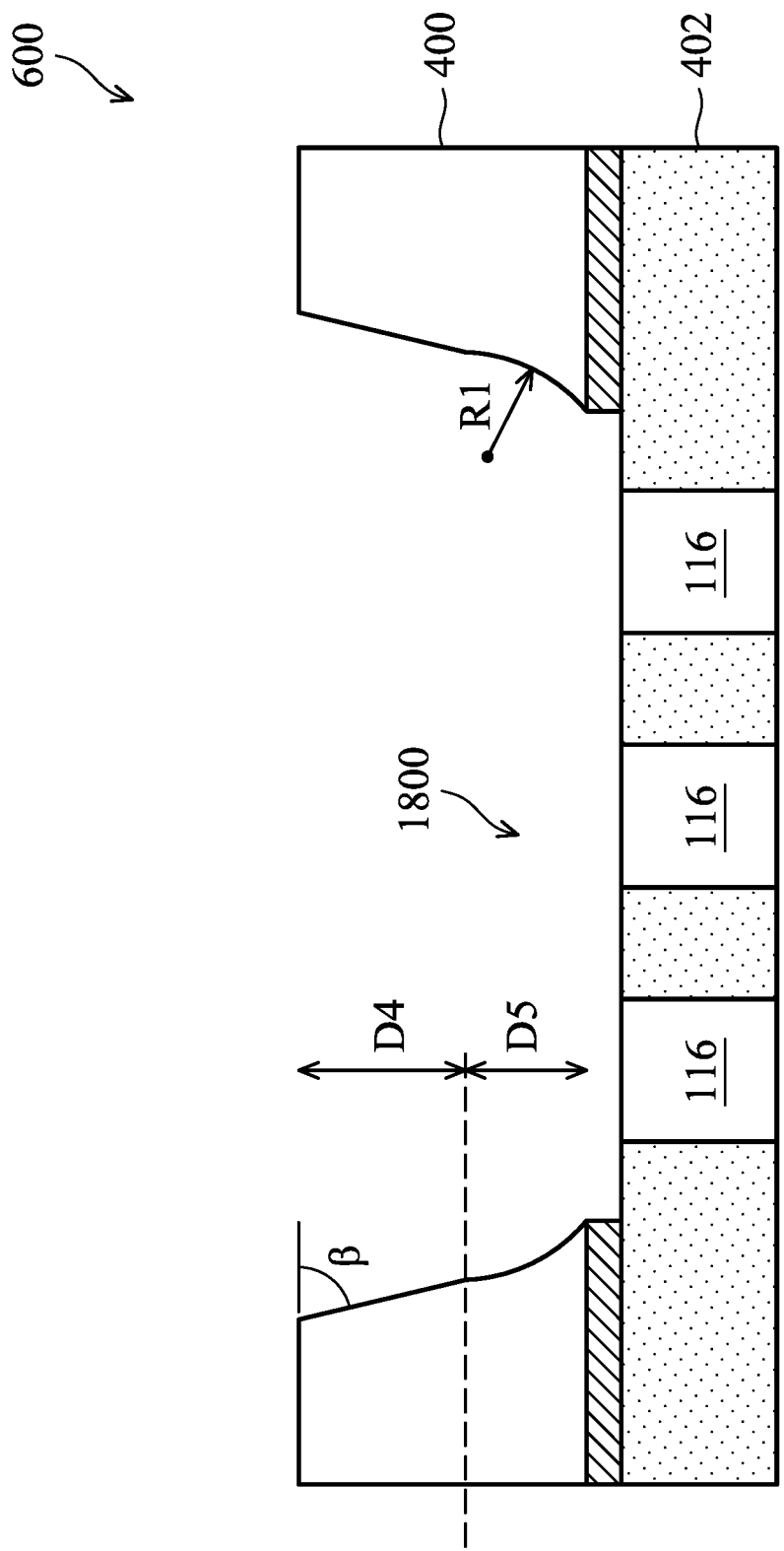
FIG. 4 and FIG. 5 illustrate various intermediary etching steps in the manufacture of a device according to alternative embodiments.

FIG. 4 illustrates another embodiment etching process performed on bonded substrate 600. Bonded semiconductor substrate 600 may comprise semiconductor substrate 400 and semiconductor die 402. Bonded semiconductor substrate 600 and bonded semiconductor substrate 300 may be similar to the features discussed above with respect to FIG. 1A where like features are formed using like processes. Semiconductor substrate 400 and semiconductor die 402 may also be similar to semiconductor substrate 100 and semiconductor die 102 respectively in regards to the features discussed above with respect to FIG. 1A. Further description of these features is omitted for brevity. The etching process may be used to form a cavity 1800. The etching process may result in the cavity 1800 having sidewalls with a profile angle β with the top surface of semiconductor substrate 400. The etching process performed may comprise a first etching process, followed by a second etching process after the first etching process that etches semiconductor substrate 400 in both the vertical and lateral directions. The first etching process results in a first etched portion in the cavity 1800 having a sidewall with a linear surface, the sidewall having a vertical depth $D_4$ from the top surface of semiconductor substrate 400. The first etching process may be similar to the etching process described above with respect to FIG. 1C. For example, during the first etching process, the passivation gas mixture (e.g., $C_4F_8/O2$) flowrate and the etching gas (e.g., $SF_6$) flowrate may have a ratio of about 2.7:1. The RF source power may about 2800 Watts, the RF secondary power source may be about 800 Watts, and the RF bias power source may be about 190 Watts, at a frequency in a range of about 10 MHz to about 15 MHz, such as about 13.56 MHz. The RF source power, RF secondary power source and the RF bias power source may be continuously supplied during the first etching process.

The second etching process takes place after the first etching process is complete and results in a second etched portion in the cavity 1800 having a sidewall with a non-linear surface. During the second etching process, the passivation gas mixture (e.g., $C_4F_8/O_2$) and the etching gas (e.g., $SF_6$) may be the same as those used during the first etching process. The sidewalls of cavity 1800 are etched without specific directionality, resulting in the sidewalls having a non-linear surface with a radius of curvature R1 and a second etched portion in the cavity 1800 having a sidewall with a non-linear surface with a vertical depth D5, measured from the point on the sidewall where the second etching process began to the bottom of the cavity 1800. The transition from the first etching process to the second etching process may take place when the RF bias power source is progressively increased with time to change the etch profile of the sidewalls of cavity 1800. In an embodiment, during the second etching process, the passivation gas mixture (e.g., $C_4F_8/O_2$) flowrate and the etching gas (e.g., $SF_6$) flowrate may have a ratio of about 2.7:1. The RF source power may about 2800 Watts and the RF secondary power source may be about 800 Watts, at a frequency in a range of about 10 MHz to about 15 MHz, such as about 13.56 MHz. The RF source power and RF secondary power source may be continuously supplied. The RF bias power source may be incrementally increased during the second etching process from a RF bias power source of about 190 Watts at the start of the second etching process to about 240 Watts at the end of the second etching process. The second etching process may result in a sidewall of the cavity 1800, over a vertical depth D5, measured from the point on the sidewall where the second etching process began to the bottom of the cavity 1800, having a non-linear surface with a radius of curvature R1 of about 380 um.

Figure 5:
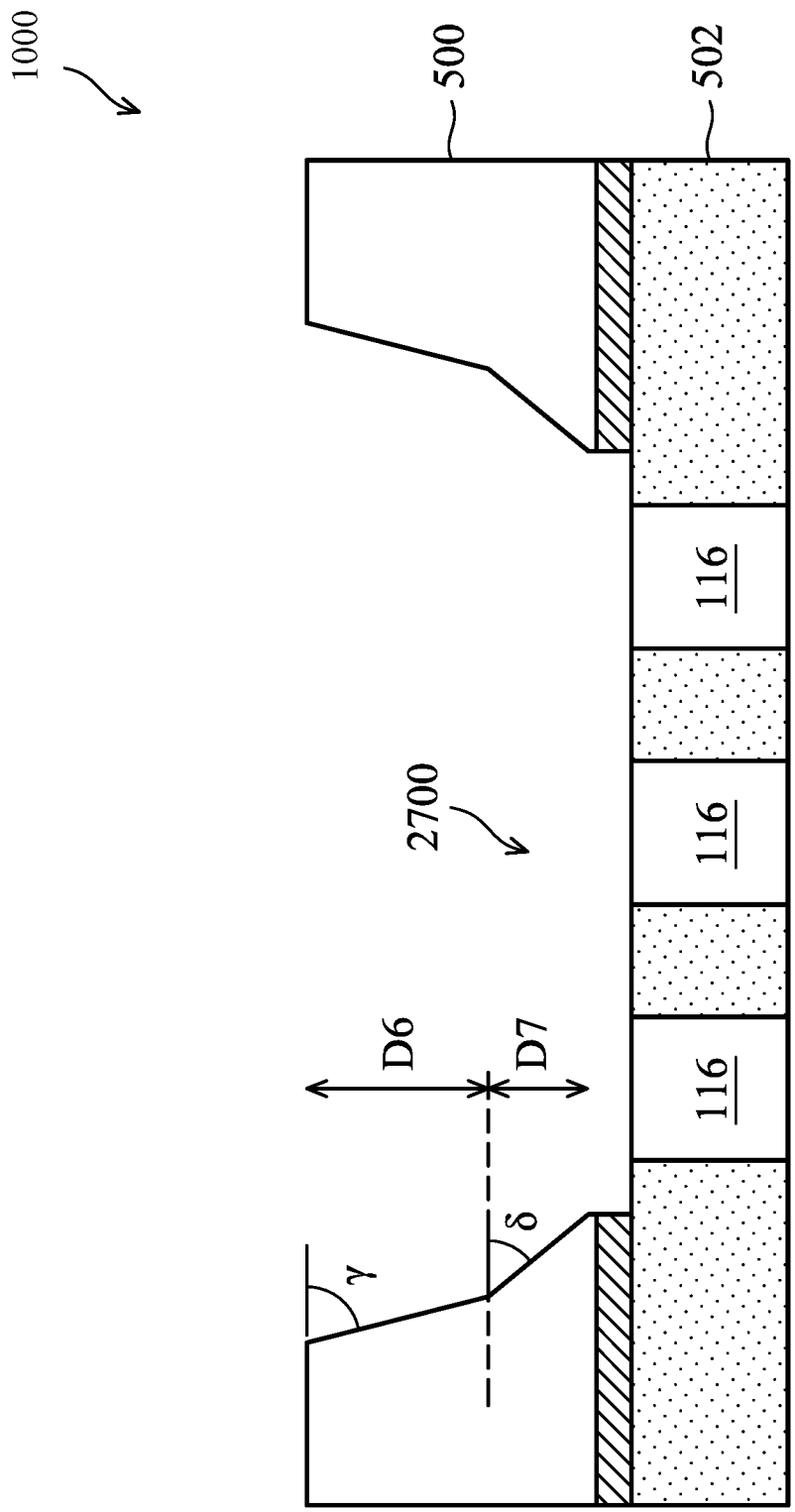

FIG. 5 illustrates another embodiment etching process performed on bonded substrate 1000. Bonded semiconductor substrate 1000 may comprise semiconductor substrate 500 and semiconductor die 502. Bonded semiconductor substrate 1000 and bonded semiconductor 300 may be similar to the features discussed above with respect to FIG. 1A where like features are formed using like processes. Semiconductor substrate 500 and semiconductor die 502 may also be similar to semiconductor substrate wo and semiconductor die 102 respectively in regards to the features discussed above with respect to FIG. 1A. Further description of these features is omitted for brevity. The etching process may be used to form a cavity 2700. The etching process performed may comprise a first etching process, followed by a second etching process after the first etching process that etches the semiconductor substrate 500 in both the vertical and lateral directions. The first etching process may result in a first etched portion in the cavity 2700 having a sidewall with a linear surface, the sidewall having a vertical depth D6 from the top surface of the semiconductor substrate 500. The first etched portion may have sidewalls with a profile angle γ with the top surface of the semiconductor substrate 500. The first etching process may be similar to the etching process described above with respect to FIG. 1C, and may use a similar passivation gas mixture (e.g. $C_4F_8/O_2$) and etching gas (e.g. $SF_6$).

The second etching process takes place after the first etching process is complete and results in a second etched portion in the cavity 2700 having a sidewall with a linear surface, the sidewall having a vertical depth D7 measured from the point on the sidewall where the second etching process began to the bottom of the cavity 2700. The second etched portion may have sidewalls with a profile angle δ with a line parallel to the top surface of semiconductor substrate 500, where the profile angle γ, of the first etched portion is not equal to the profile angle δ, of the second etched portion. This profile angle difference may be achieved by varying the passivation gas mixture ($C_4F_8/O_2$) flowrate and the etching gas ($SF_6$) flowrate ratio and/or the RF bias power source between the first etching process and the second etching process.

Using the various formation steps illustrated in FIG. 1A through FIG. 5, a backside cavity may be formed in a device (e.g., a light emitting diode (LED) device, a microelectromechanical systems (MEMS) device, or the like). The processes and devices described disclose methods for a dry etch process applied to, but not limited to, the formation of a silicon backside cavity with controllable etch profile angles. An advantageous features of one or more embodiments disclosed may include the ability to control the etch profile angle and to provide better deposition (e.g., physical vapor deposition (PVD)) step coverage on the backside cavity walls. Another advantageous feature is the ability to form a backside cavity having sidewalls with more than one etch profile angle. By employing of an embodiment such as those disclosed, there is less dependency upon a specific crystal orientation of the silicon wafer such as would be the case in a wet etching process. In addition, some embodiments may reduce the need for one or more masking layers during the formation of the backside cavity, simplifying the process and making it more cost-effective.

In accordance with an embodiment, a method includes bonding a first surface of a first semiconductor substrate to a first surface of a second semiconductor substrate; patterning a mask layer on a second surface of the first semiconductor substrate to expose a first area of the first semiconductor substrate, the second surface being opposite the first surface; and forming a cavity in the first area of the first semiconductor substrate, where forming the cavity includes supplying a passivation gas mixture that deposits a passivation layer on a bottom surface and sidewalls of the cavity, where during deposition of the passivation layer, a deposition rate of the passivation layer on the bottom surface of the cavity is the same as a deposition rate of the passivation layer on sidewalls of the cavity; and etching the first area of the first semiconductor substrate using an etching gas, where the etching gas is supplied concurrently with the passivation gas mixture, where etching the first area of the first semiconductor substrate includes etching in a vertical direction at a greater rate than etching in a lateral direction. In an embodiment, the passivation gas mixture includes octafluorocyclobutane ($C_4F_8$) and oxygen ($O_2$), and the etching gas includes sulfur hexafluoride ($SF_6$). In an embodiment, a ratio of a flowrate of $C_4F_8/O_2$ to a flowrate of $SF_6$ is in a range of 4:1 to 0.5:1. In an embodiment, forming the cavity results in sidewalls of the cavity having a profile angle with a top surface of the first semiconductor substrate, where the profile angle is in a range of 55° to 90°. In an embodiment, forming the cavity results in the cavity having a vertical depth of 720 μm or less, the vertical depth being measured from a top surface of the first semiconductor substrate to the bottom surface of the cavity. In an embodiment, forming the cavity results in the cavity having a width, measured from a top of a first sidewall of the cavity to a top of a second sidewall of the cavity of about 17 mm or less. In an embodiment, the method further includes thinning a second surface of the second semiconductor substrate using a grinding process that results in the second semiconductor substrate having a thickness of about 50 μm. In an embodiment, a vertical depth of the cavity, measured from a top surface of the first semiconductor substrate to the bottom surface of the cavity, is larger than a thickness of the second semiconductor substrate.

In accordance with yet another embodiment, a method includes bonding a first semiconductor substrate to a second semiconductor substrate; patterning a mask layer on an unbonded surface of the first semiconductor substrate; and etching a cavity in the first semiconductor substrate using the mask layer as a patterning mask, where etching the cavity includes generating a deposition plasma by exciting a passivation gas mixture, the deposition plasma depositing a passivation layer on a bottom surface and sidewalls of the cavity, where a deposition rate of the passivation layer on the bottom surface of the cavity is the same as a deposition rate of the passivation layer on sidewalls of the cavity; and generating an etching plasma by exciting an etching gas, where generating the etching plasma and the deposition plasma takes place concurrently, a first RF power source accelerating ions from the etching plasma towards the bottom surface of the cavity, where a vertical etching rate of the etching plasma is more significant than a lateral etching rate of the etching plasma. In an embodiment, depositing the passivation layer includes the deposition plasma depositing a polymer layer on the bottom surface and sidewalls of the cavity. In an embodiment, a second RF power source excites the passivation gas mixture and the etching gas. In an embodiment, the first RF power source is disposed below the second semiconductor substrate and the second RF power source is disposed above the unbonded surface of the first semiconductor substrate. In an embodiment, patterning the mask layer includes patterning a photo resist layer on the unbonded surface of the first semiconductor substrate. In an embodiment, the method further includes forming a first part of the cavity, the first part of the cavity having linear sidewalls, the sidewalls of the first part of the cavity having a profile angle with a top surface of the first semiconductor substrate, where the profile angle is in a range of 55° to 90°; and forming a second part of the cavity, the second part of the cavity having non-linear sidewalls, the sidewalls of the second part of the cavity having a radius of curvature R1, where R1 is in a range of 200 um to 800 um. In an embodiment, forming the second part of the cavity includes progressively increasing the magnitude of the first RF power source with time. In an embodiment, during the forming of the first part of the cavity, a ratio of a flowrate of $C_4F_8/O_2$ to a flowrate of $SF_6$ is lower than 2.7:1, and the profile angle of the sidewalls of the first part of the cavity is larger than 80°. In an embodiment, during the forming of the first part of the cavity, a ratio of a flowrate of $C_4F_8/O_2$ to a flowrate of $SF_6$ is higher than 2.7:1, and the profile angle of the sidewalls of the first part of the cavity is smaller than 80°.

In accordance with an embodiment, a semiconductor device includes a first semiconductor substrate; a second semiconductor substrate bonded to the first semiconductor substrate; and a cavity extending through the first semiconductor substrate, the cavity including a top portion with sidewalls having a first sidewall profile; and a bottom portion having sidewalls having a second sidewall profile, the sidewalls of the top portion of the cavity having a first profile angle with a top surface of the first semiconductor substrate, the sidewalls of the bottom portion of the cavity having a second profile angle with a top surface of the first semiconductor substrate, where the first profile angle is different from the second profile angle. In an embodiment, the first semiconductor substrate includes silicon having a crystalline orientation of <100>, <110>, or <110> family. In an embodiment, the first profile angle and the second profile angle are each in a range of 55° to 90°.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   bonding a first semiconductor substrate to a second semiconductor substrate;
   patterning a mask layer on an unbonded surface of the first semiconductor substrate; and
   etching a cavity in the first semiconductor substrate using the mask layer as a patterning mask, wherein etching the cavity comprises:
   generating a deposition plasma by exciting a passivation gas mixture, the deposition plasma deposits a passivation layer on a bottom surface and sidewalls of the cavity, wherein a deposition rate of the passivation layer on the bottom surface of the cavity is the same as a deposition rate of the passivation layer on sidewalls of the cavity; and
   generating an etching plasma by exciting an etching gas, wherein generating the etching plasma and the deposition plasma taking place concurrently, a first RF power source accelerates ions from the etching plasma towards the bottom surface of the cavity, wherein a vertical etching rate of the etching plasma is more significant than a lateral etching rate of the etching plasma.

2. The method of claim 1, wherein depositing the passivation layer comprises the deposition plasma depositing a polymer layer on the bottom surface and sidewalls of the cavity.

3. The method of claim 1, wherein a second RF power source excites the passivation gas mixture and the etching gas.

4. The method of claim 3, wherein the first RF power source is disposed below the second semiconductor substrate and the second RF power source is disposed above the unbonded surface of the first semiconductor substrate.

5. The method of claim 1, wherein patterning the mask layer comprises patterning a photo resist layer on the unbonded surface of the first semiconductor substrate.

6. The method of claim 1, wherein etching the cavity further comprises:
   forming a first part of the cavity, the first part of the cavity having linear sidewalls, the sidewalls of the first part of the cavity having a profile angle with a top surface of the first semiconductor substrate, wherein the profile angle is in a range of 55° to 90°; and
   forming a second part of the cavity, the second part of the cavity having non-linear sidewalls, the sidewalls of the second part of the cavity having a radius of curvature R1, wherein R1 is in a range of 200 μm to 800 μm.

7. The method of claim 6, wherein forming the second part of the cavity includes progressively increasing the magnitude of the first RF power source with time.

8. The method of claim 6, wherein during forming of the first part of the cavity, a ratio of a flowrate of $C_4F_8/O_2$ to a flowrate of $SF_6$ is lower than 2.7:1, and the profile angle of the sidewalls of the first part of the cavity is larger than 80°.

9. The method of claim 6, wherein during forming of the first part of the cavity, a ratio of a flowrate of $C_4F_8/O_2$ to a flowrate of $SF_6$ is higher than 2.7:1, and the profile angle of the sidewalls of the first part of the cavity is smaller than 80°.

10. A method comprising:
    bonding a first surface of a first semiconductor substrate to a first surface of a second semiconductor substrate;
    patterning a mask layer on a second surface of the first semiconductor substrate to expose a first area of the first semiconductor substrate, the second surface is opposite the first surface; and
    forming a cavity in the first area of the first semiconductor substrate, wherein after forming the cavity a dielectric layer on the second semiconductor substrate is exposed, and wherein forming the cavity comprises:
    exciting a passivation gas mixture to form a deposition plasma, the deposition plasma depositing a passivation layer on a bottom surface and sidewalls of the cavity, wherein during deposition of the passivation layer, a deposition rate of the passivation layer on the bottom surface of the cavity is the same as a deposition rate of the passivation layer on sidewalls of the cavity; and exciting an etching gas to form an etching plasma, wherein the etching plasma etches the first area of the first semiconductor substrate at a greater rate in a vertical direction than in a lateral direction, wherein the etching gas and the passivation gas mixture are supplied concurrently.

11. The method of claim 10, wherein the passivation gas mixture comprises octafluorocyclobutane ($C_4F_8$) and oxygen ($O_2$), and the etching gas comprises sulfur hexafluoride ($SF_6$).

12. The method of claim 11, wherein a ratio of a flowrate of $C_4F_8$ and $O_2$ to a flowrate of $SF_6$ is in a range of 4:1 to 0.5:1.

13. The method of claim 10, wherein forming the cavity results in sidewalls of the cavity having a profile angle with a top surface of the first semiconductor substrate, wherein the profile angle is in a range of 55° to 90°.

14. The method of claim 10, wherein forming the cavity results in the cavity having a vertical depth of 720 μm or less, the vertical depth is measured from a top surface of the first semiconductor substrate to the bottom surface of the cavity.

15. The method of claim 10, wherein forming the cavity results in the cavity having a width, measured from a top of a first sidewall of the cavity to a top of a second sidewall of the cavity of about 17 mm or less.

16. The method of claim 10, further comprising thinning a second surface of the second semiconductor substrate using a grinding process that results in the second semiconductor substrate having a thickness of about 50 μm.

17. The method of claim 10, wherein a vertical depth of the cavity, measured from a top surface of the first semiconductor substrate to the bottom surface of the cavity, is larger than a thickness of the second semiconductor substrate.

18. A method comprising:
bonding a first surface of a semiconductor substrate to a first surface of a semiconductor die;
patterning a mask layer on a second surface of the semiconductor substrate, wherein the second surface is opposite the first surface of the semiconductor substrate;
etching a cavity in the semiconductor substrate using the mask layer as a patterning mask, wherein etching the cavity comprises:
etching an upper portion of the cavity by exciting a first passivation gas mixture to form a first deposition plasma and a first etching gas to form a first etching plasma, wherein the first passivation gas mixture is supplied at a first flowrate and the first etching gas is supplied at a second flowrate, wherein the upper portion of the cavity has a first profile angle with a top surface of the semiconductor substrate; and
after etching the upper portion of the cavity, etching a lower portion of the cavity by exciting a second passivation gas mixture to form a second deposition plasma and a second etching gas to form a second etching plasma, wherein the second passivation gas mixture is supplied at a third flowrate and the second etching gas is supplied at a fourth flowrate, wherein a first ratio of the first flowrate to the second flowrate is different to a second ratio of the third flowrate to the fourth flowrate, the lower portion of the cavity has a second profile angle with the top surface of the semiconductor substrate, the second profile angle and the first profile angle being different; and
depositing a conformal conductive layer on sidewalls of the upper portion of the cavity, the lower portion of the cavity, and a portion of the first surface of the semiconductor die.

19. The method of claim 18, wherein the first passivation gas mixture and the second passivation gas mixture are the same and the first etching gas and the second etching gas are the same.

20. The method of claim 18, wherein the first profile angle and the second profile angle are each in a range of 55° to 90°.

* * * * *

UNITED STATES PATENT AND TRADEMARK OFFICE
CERTIFICATE OF CORRECTION

PATENT NO. : 11,177,137 B2
APPLICATION NO. : 16/746067
DATED : November 16, 2021
INVENTOR(S) : Wen-Hsiung Lu et al.

Page 1 of 1

It is certified that error appears in the above-identified patent and that said Letters Patent is hereby corrected as shown below:

In the Claims

Claim 18, Column 16, Line 25; delete "flowrate, the lower" and insert --flowrate, wherein the lower--.

Signed and Sealed this
Twenty-eighth Day of December, 2021

Drew Hirshfeld
*Performing the Functions and Duties of the*
*Under Secretary of Commerce for Intellectual Property and*
*Director of the United States Patent and Trademark Office*